United States Patent [19]

Botka

[11] Patent Number: 5,550,466
[45] Date of Patent: Aug. 27, 1996

[54] HINGED CONDUIT FOR ROUTING CABLES IN AN ELECTRONIC CIRCUIT TESTER

[75] Inventor: Julius K. Botka, Santa Rosa, Calif.

[73] Assignee: Hewlett-Packard Company, Palo Alto, Calif.

[21] Appl. No.: 315,641

[22] Filed: Sep. 30, 1994

[51] Int. Cl.$^6$ ................................................. G01R 31/00
[52] U.S. Cl. ..................... 324/158.1; 324/758; 371/22.1; 191/12 R; 191/23 R
[58] Field of Search ................................ 324/158.1, 754, 324/758; 191/12 R, 12.4, 23 R, 28, 33 R, 60, 60.2, 60.3; 371/22.1; 414/590, 673

[56] References Cited

U.S. PATENT DOCUMENTS

| | | | |
|---|---|---|---|
| 4,517,512 | 5/1985 | Petrich et al. | 371/22.1 |
| 4,893,074 | 1/1990 | Holt et al. | 324/758 |

*Primary Examiner*—Kenneth A. Wieder
*Assistant Examiner*—Kourosh Cyrus Khosravi

[57] ABSTRACT

An electronic circuit tester for measuring the response of electrical signals applied to an electronic circuit under test is provided with a pivotable connection for conduit through which cables are routed from a test head coupled to the electronic circuit under test to the remainder of the tester. The test head includes a chassis having a relieved region in which a bracket is selectively mounted. The bracket has first and second legs disposed at a distance from one another, the first and second legs each being provided with an approximately circular hole to provide a bearing surface for pivotable movement. A fitting having first and second approximately tubular arms extending outwardly from an integral transversely depending conduit portion is connected to the chassis with each of the first and second arms rotatably captured in the holes of the respective first and second legs of the bracket when the bracket is mounted to the chassis. Finally, a conduit is selectively connected to the conduit portion of the fitting for routing cables. Strain relief is additionally provided at the interconnection of the cables to circuitry in the test head. Also, cooling air can be supplied through the conduit to the circuitry in the test head.

23 Claims, 5 Drawing Sheets

HINGED CONDUIT FOR ROUTING CABLES IN AN ELECTRONIC CIRCUIT TESTER

BACKGROUND OF THE INVENTION

This invention relates to systems for testing electronic circuits by applying and/or measuring electrical signals and, more particularly, to electronic circuit test systems for applying electrical signals to a packaged device or integrated circuit, or a device or integrated circuit chip on wafer, and measuring the response of the device or integrated circuit to the applied electrical signals. Specifically, one embodiment of the invention provides a hingedly connected conduit for routing cables in an electronic circuit tester between a test head that interfaces with the device or integrated circuit being tested and the remainder of the tester. The pivotable conduit in accordance with one embodiment of the invention is particularly adaptable to a high-frequency electronic circuit tester for reducing strain on coaxial cables typically used to interconnect the test head and the remainder of the tester and for facilitating the setup and calibration of, and measurements with, the tester for testing high-frequency devices and integrated circuits, thereby improving operator efficiency and enhancing overall throughput.

Programmable electronic circuit testers are typically used during the manufacture of electronic devices and integrated circuits to test the performance of the device or integrated circuit being manufactured. Tests are conducted to assure that the device or integrated circuit satisfies associated design performance specifications. In order to test the device or integrated circuit, the electronic circuit tester is programmed to inject an electrical signal or suite of electrical signals into the device or integrated circuit under test and to measure the response(s). The electronic circuit tester cannot only be used to test finished packaged devices and integrated circuits, but is also frequently used to perform tests at various stages of the manufacture of the device or integrated circuit between initial wafer processing and final packaging.

A conventional programmable electronic circuit tester, generally indicated by the numeral 10, is shown in FIG. 1. The electronic circuit tester 10 comprises a test head 12 electrically connected by cables routed through a conduit 14 to a rack(s) 16 of electronic test and measurement instruments, such as ac and dc electrical signal generators for applying electrical signals to a device or integrated circuit interfaced to the test head, and signal analyzers, for example, an oscilloscope and a network analyzer, for measuring the response(s) to those applied electrical signals. As shown in FIG. 1, the test head 12 interfaces to a device or integrated circuit through a load board 18 connected to the cables in the conduit 14 and a fixture board 20 in turn connected to the load board. The configuration of the load board 18 depends on the type of device or integrated circuit being tested, such as an analog or digital electronic circuit, while the configuration of the fixture board 20 is typically specific to the family of device or integrated circuit being tested.

As shown in FIG. 1, the test head 12 is mounted on a dolly 22. Since the electronic circuit tester 10 can be employed to test both packaged devices and integrated circuits, as well as device or integrated circuit chips on wafer, the test head 12 is preferably mounted by pivotable connections 24 to the dolly 22. The pivotable connections 24 enable the test head 12 to be positioned in an upward facing horizontal position so that the appropriate load and fixture boards 18 and 20 can be mounted on the test head and calibrated by an operator. The test head 12 can then be pivoted to a vertical position so that the fixture board 20 can interface with a material handler, for example, to test packaged devices or integrated circuits. Finally, the test head 12 can be pivoted to a downward facing horizontal position so that the fixture board 20 can interface with a wafer to test device or integrated circuit chips on the wafer.

However, the conduit 14 through which the cables from the test head 12 are routed to the rack(s) 16 is fixedly attached to the housing of the test head, as shown in FIG. 1. Consequently, when the test head 12 is pivoted among the various positions for setup, calibration, and actual testing, the conduit 14 and contained cables resist pivotable movement of the test head. Furthermore, in the setup and calibration position shown in FIG. 1, the conduit 14 extends outwardly from the test head 12 and interferes with setup and calibration of the electronic circuit tester 10 by the operator. Finally, in all but one of the pivotable positions of the test head 12, the conduit 14 and contained cables are strained.

It would therefore be desirable to provide a structure to easily position the test head 12 to all of the desired positions for setup and calibration and actual testing. Additionally, it is desirable to provide a structure whereby strain on the conduit 14 and the cables within the conduit is relieved. Such a structure would facilitate the use of the electronic circuit tester 10 to perform setup and calibration, as well as the measurement process.

SUMMARY OF THE INVENTION

One embodiment of the invention provides a hinged conduit for cables connected between a test head of an electronic circuit tester and the remainder of the tester. That is, a pivotable connection is provided for the conduit through which the cables are routed from the test head coupled to the electronic circuit under test to the means for applying an electrical signal or suite of electrical signals to, and measuring the response(s) of, an electronic circuit under test.

In accordance with the embodiment of the invention, the test head comprises a chassis having a relieved region in which a bracket is selectively mounted. The bracket comprises first and second legs disposed at a distance from one another, the first and second legs each being provided with an approximately circular hole to provide a bearing surface for pivotable movement. A fitting comprising first and second approximately tubular arms extending outwardly from an integral transversely depending conduit portion is connected to the chassis with each of the first and second arms rotatably captured in the holes of the respective first and second legs of the bracket when the bracket is mounted to the chassis. Finally, a conduit is selectively connected to the conduit portion of the fitting for routing the cables.

In accordance with the one embodiment of the invention, the chassis is pivotable with respect to the conduit to at least three positions including a first position with the chassis positioned in a first approximately upward facing horizontal position so that a load board and a fixture board can be mounted on the test head and calibrated by an operator, a second approximately vertical position so that the fixture board mounted on the test head can be interfaced with a material handler, and a third approximately downward facing horizontal position so that the fixture board can interface with a wafer to test an electronic circuit on the wafer. Therefore, setup and calibration of, and measurements with, the electronic circuit tester are facilitated. This increases the speed of the measurement process.

Additionally, strain relief means is preferably provided at the interconnection of the cables to circuitry in the test head. The strain relief means comprises a curved plate mounted to at least one of the first and second legs of the bracket, the plate having a plurality of perforations. The strain relief means also comprises at least one cable tie intertwined through the perforations and around the cables to secure the cables to the plate. Therefore, strain on the cables is relieved when the chassis is pivoted. Preferably, cooling air is supplied through the conduit to the circuitry in the test head.

BRIEF DESCRIPTION OF THE DRAWINGS

The above and other objects and features and the concomitant advantages of the present invention will be better understood and appreciated by those skilled in the art in view of the description of the preferred embodiments given below in conjunction with the accompanying drawings. In the drawings:

FIG. 5, comprising

DETAILED DESCRIPTION OF THE PREFERRED EMBODIMENTS

Figure 1:
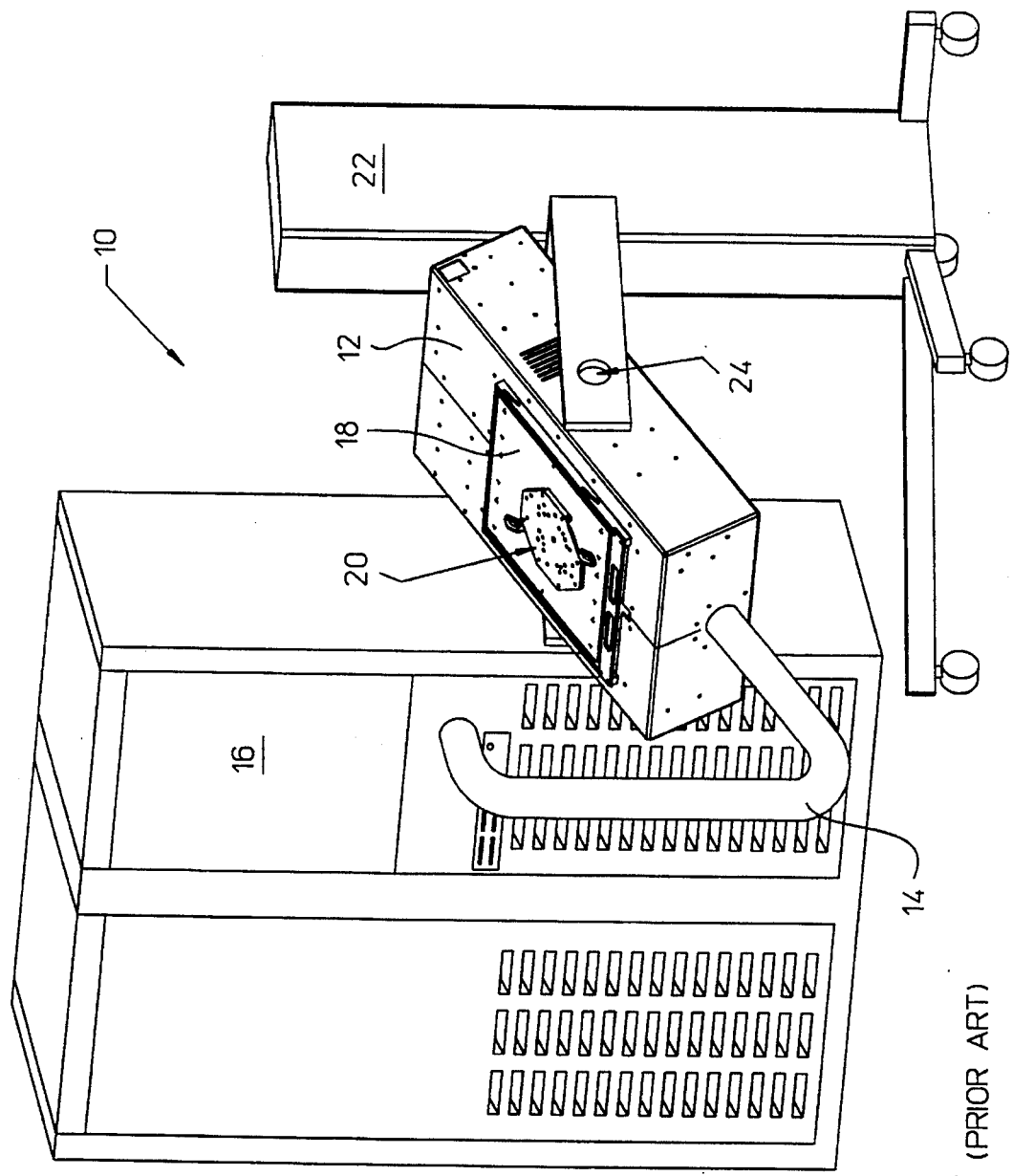
FIG. 1 is an isometric view of a conventional electronic circuit tester.
Figure 2:
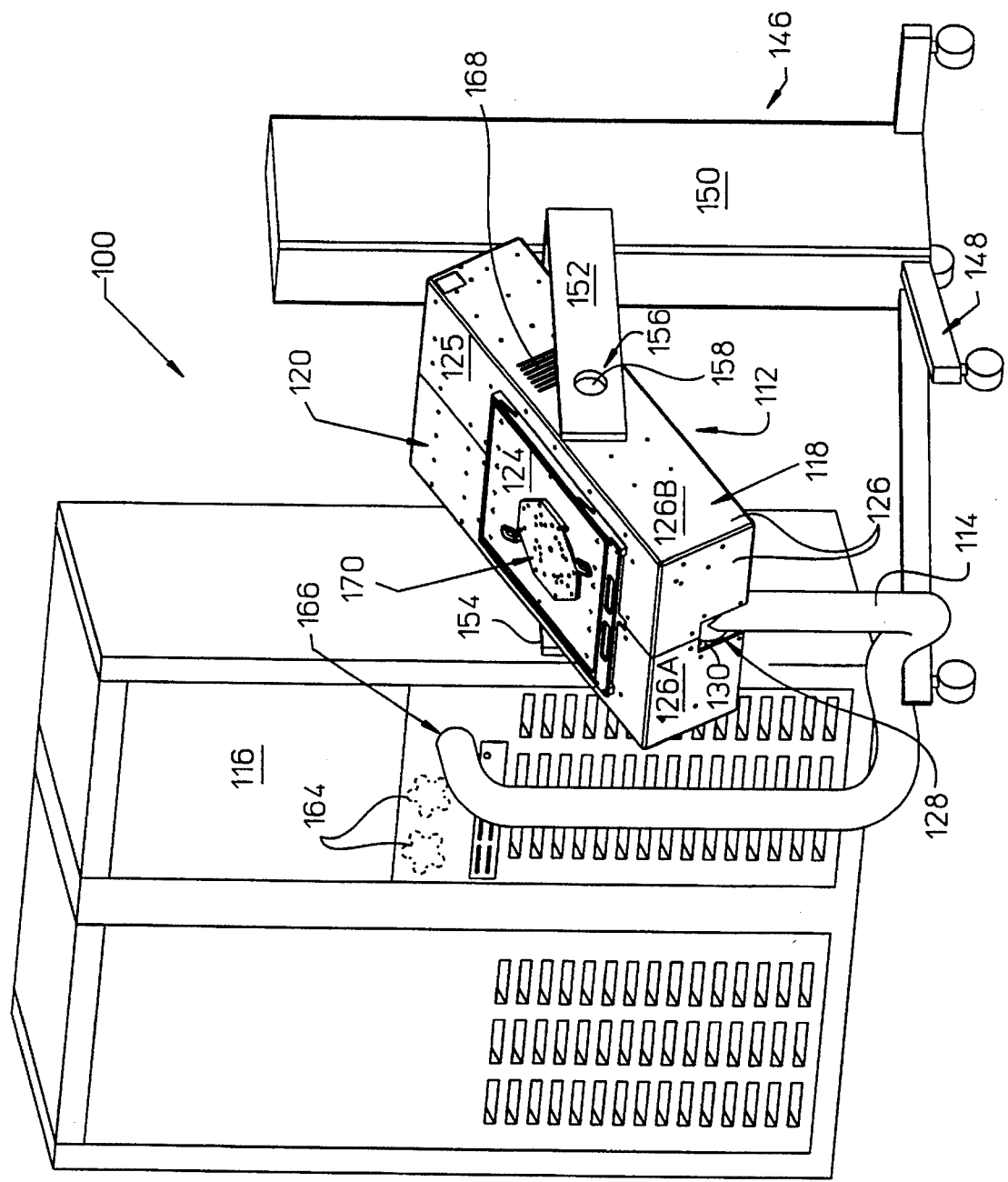
FIG. 2 is an isometric view of an electronic circuit tester in accordance with one embodiment of the invention.

FIG. 2 shows an electronic circuit tester, generally indicated by the numeral 100, in accordance with one embodiment of the invention, in which a test head 112 is interconnected by a hinged conduit 114 to the remainder of the tester comprised of a rack(s) 116 of electronic test and measurement instruments, such as ac and dc electrical signal generators for applying electrical signals to a device or integrated circuit interfaced to the test head, and signal analyzers for measuring the response(s) to those applied electrical signals.

Figure 3:
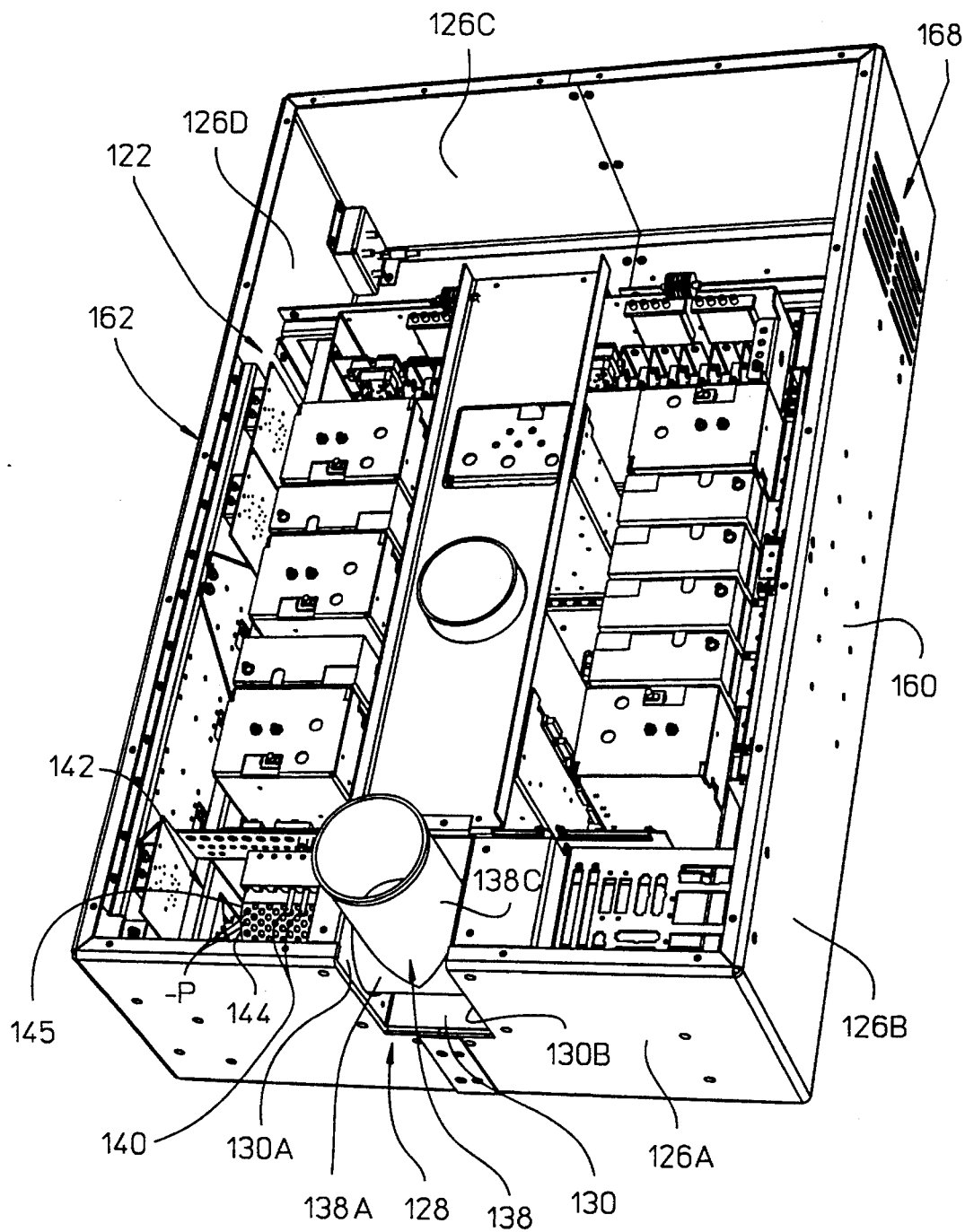
FIG. 3 is an isometric view of the obverse of a test head included in the electronic circuit tester shown in FIG. 2.
Figure 4:
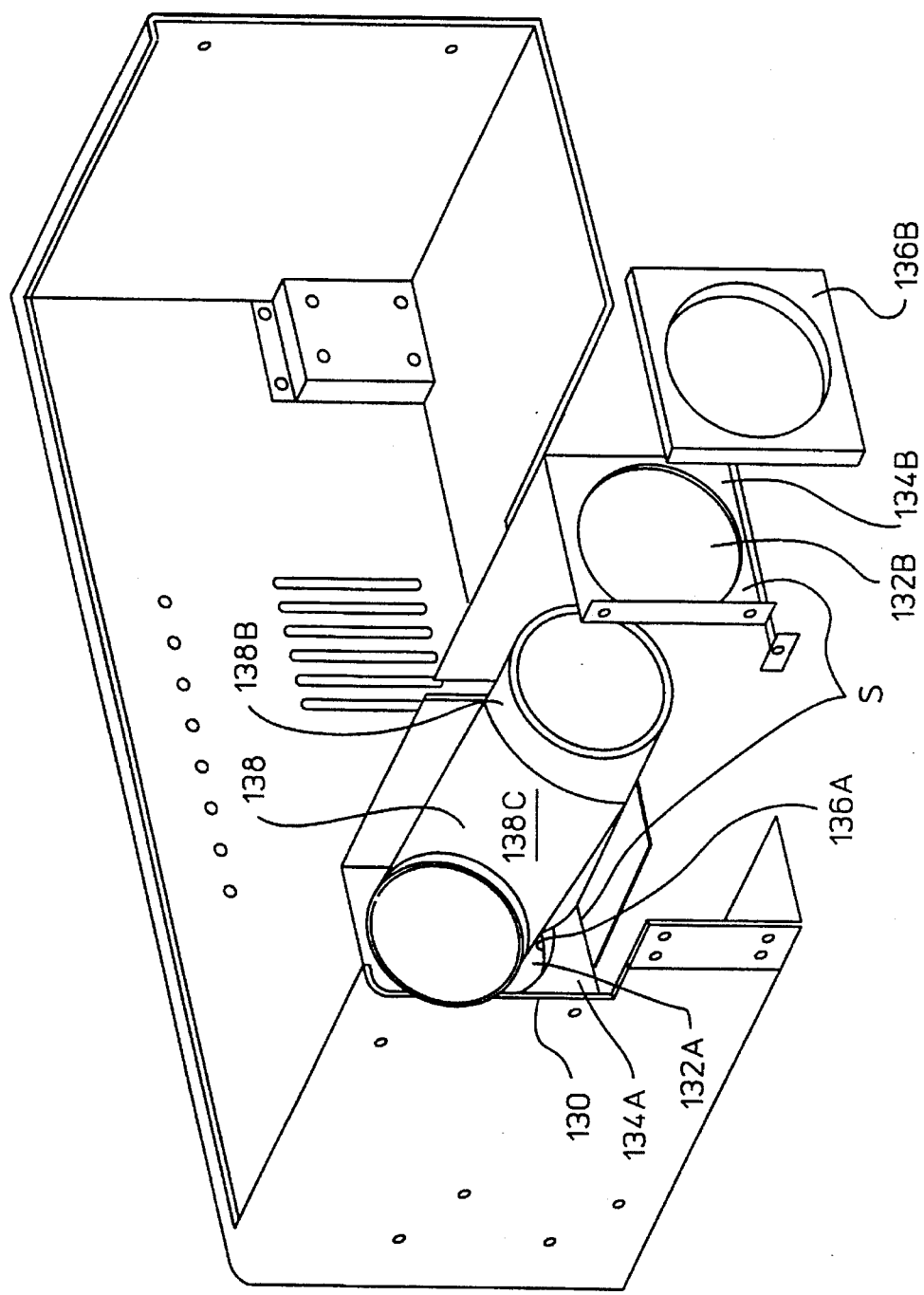
FIG. 4 is an exploded view of a portion of the test head shown in FIG. 3 to show one embodiment of hinged conduit connection in accordance with the invention.

Considered in more detail, the test head 112 comprises a housing 118, as shown in FIGS. 2–4. One implementation of the housing 118 comprises a chassis 120 for mounting circuitry 122 for connection to an external load board 124. The chassis 120 comprises an approximately planar portion 125 which can be rectangular, as shown in FIG. 2. The chassis 120 also comprises a sidewall portion 126 integral with the planar portion 125 and depending approximately perpendicularly away from the planar portion. The sidewall portion 126 can comprise a first sidewall 126A, a second sidewall 126B, a third sidewall 126C, and a fourth sidewall 126D depending perpendicularly away from the planar portion 125 to form a rectangular surround for the circuitry 122 connected to the load board 124. The sidewall portion 126 additionally comprises a relieved region 128. For example, the relieved region 128 can comprise an approximately rectangular cutout in the first sidewall 126A of the sidewall portion 126 of the chassis 120.

The test head 112 additionally comprises a bracket 130 selectively mounted in the relieved region 128 of the sidewall portion 126 of the chassis 120, as best shown in FIGS. 3 and 4. The bracket 130 comprises first and second legs 130A and 130B disposed at a distance from one another. The first and second legs 130A and 130B are each provided with an approximately circular hole 132A and 132B, respectively, to provide a bearing surface S for pivotable movement. Preferably, each of the first and second legs 130A and 130B comprises a flange 134A and 134B, respectively, mounted to the first sidewall 126A of the sidewall portion 126 of the chassis 120 and an end cap 136A and 136B, respectively, disposed at a distance from the respective flanges, as shown in FIG. 4. The flanges 134A and 134B and the end caps 136A and 136B are each provided with the respective holes 132A and 132B to provide the bearing surface S for pivotable movement.

The test head 112 further comprises a fitting 138. The fitting 138 comprises first and second approximately tubular arms 138A and 138B extending outwardly from an integral transversely depending conduit portion 138C. When the test head 112 is assembled, the first and second arms 138A and 138B of the fitting 138 are captured in the respective holes 132A and 132B of the first and second legs 130A and 130B of the bracket 130 as the bracket is mounted to the chassis 120, whereby the respective first and second arms of the fitting are in contact with the bearing surface S to permit pivotable movement of the fitting.

The conduit 114 is selectively connected to the conduit portion 138C of the fitting 138 for routing cables 140 connected to the circuitry 122 to the rack(s) 116. Preferably, strain relief means 142 is disposed between at least one of the first and second arms 138A and 138B of the fitting 138 and the circuitry 122 for relieving strain on the cables 140. One implementation of strain relief means 142 comprises a curved plate 144 mounted to at least one of the first and second legs 130A and 130B of the bracket 130. The plate 144 is provided with a plurality of perforations P. Additionally, the strain relief means 142 comprises at least one cable tie 145 intertwined through the perforations and around the cables 140 to secure the cables to the plate 144.

The electronic circuit tester 100 additionally comprises a dolly 146. The dolly 146 comprises a base 148, a column 150 fixed to the base, and first and second arms 152 and 154 mounted to the column and extending outwardly from the column. The dolly 146 also comprises pivot means 156 mounted on the first and second arms 152 and 154 of the dolly. Adapter plates 158 are mounted on the sidewalls 126B and 126D of the sidewall portion 126 of the chassis 120 at first and second pivot regions 160 and 162. The pivot means 156 is interfitted with the adapter plates 158 to mount the test head 112 to the dolly 146 to provide a pivot connection between the test head and the dolly.

The dolly 146 and the pivot means 156 are conventional and currently found in electronic circuit testers and therefore do not form an independent part of this invention. For example, the dolly 146 and the pivot means 156 can be obtained from Reid-Ashman Manufacturing Company.

Finally, in the event that cooling is needed for the circuitry 122, the rack(s) 116 preferably house at least one cooling fan 164 to pressurize the region 166 at which the conduit 114 is connected to the rack(s). Additionally, the conduit 114 is sized to have an adequate diameter to not only route the cables 140 from the test head 112 to the rack(s) 116, but also to permit cooling air to flow through the conduit to the test head, and the sidewalls 126B and 126D are provided with vents 168 for the cooling air to exit the test head. This avoids the need to provide a cooling fan in the test head 112 which could cause vibration that would affect the reliability of contact between probes and devices or integrated circuits on wafers.

Figure 5A:
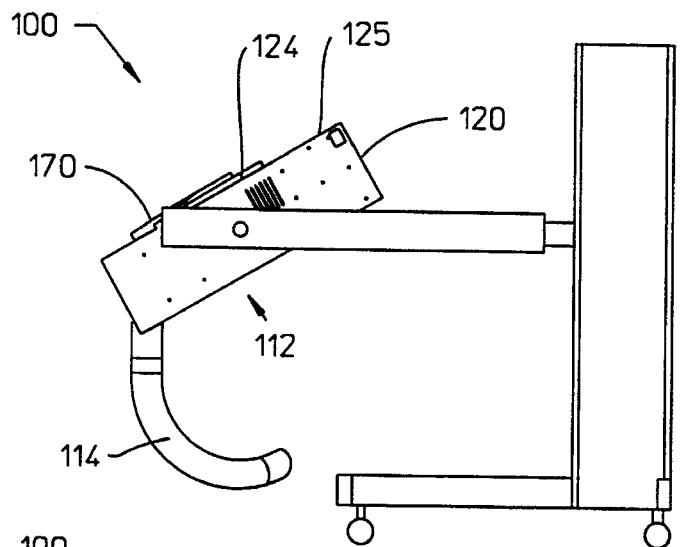
FIGS. 5A–5C, illustrates typical operative positions of the electronic circuit tester shown in FIG. 2.
Figure 5B:
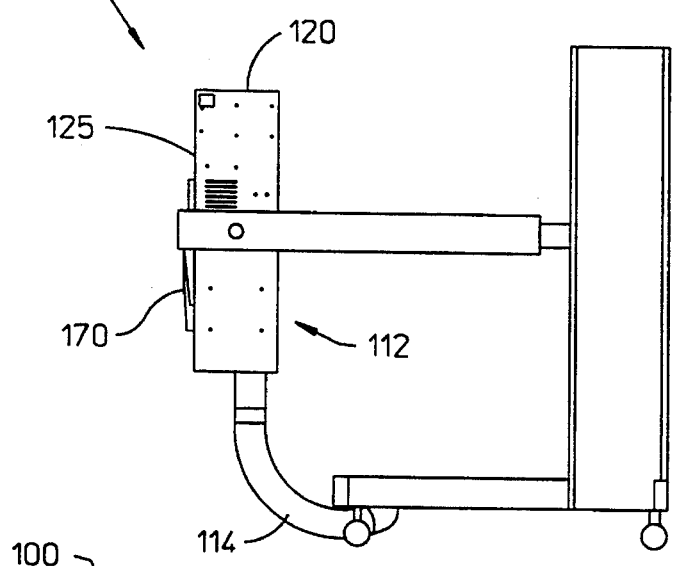
Figure 5C:
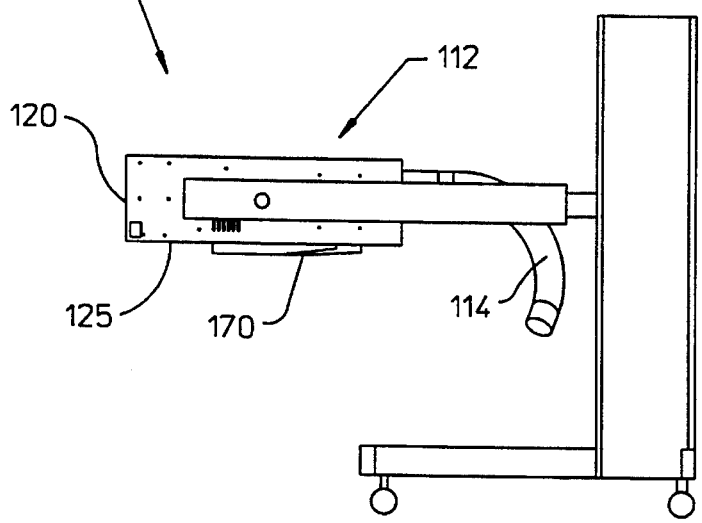

In operation of the electronic circuit tester 100, the chassis 120 is pivotable with respect to the conduit 114 to at least three positions. As shown in FIG. 5A, the chassis 120 can be pivoted to a first position with the approximately planar portion 125 of the chassis positioned in an approximately upward facing horizontal position so that the load board 124 and a fixture board 170 can be mounted to the test head 112 and calibrated by an operator. As shown in FIG. 5B, the chassis 120 can be pivoted to a second position with the approximately planar portion 125 of the chassis positioned in an approximately vertical position so that the fixture board 170 can be interfaced with a material handler (not shown) for testing devices or integrated circuits manipulated by the material handler. Finally, the chassis 120 can be pivoted to a third position with the planar portion 125 of the chassis in an approximately downward facing horizontal position so that the fixture board 170 can interface with a wafer to test a device or integrated circuit chip on the wafer. Accordingly, setup and calibration of, and measurements with, the electronic circuit tester 100 are facilitated.

The test head 112 having the hinged conduit 114 in accordance with one embodiment of the invention provides more efficient operation of the electronic circuit tester 100. The conduit 114 does not substantially impede positioning of the test head 112 during setup, calibration, and actual testing. This is a major advantage for operators who must test different devices and integrated circuits at various stages of manufacture from wafer to packaged electronic circuit.

It will be understood and appreciated that the embodiment of the present invention described above is susceptible to various additional modifications, changes, and adaptations. For example, although the foregoing description discloses a electronic circuit tester which measures high-frequency electrical signals, the principles of the invention also apply to testers which operate in the optical frequency range and measure light waves or, alternatively, testers which operate at lower frequencies. All is intended to be comprehended within the meaning and range of equivalents of the appended claims.

What is claimed is:

1. A test head for an electronic circuit tester, comprising:
    a housing, the housing comprising a chassis for mounting circuitry for connection to an external load board, the chassis including a first portion and a sidewall portion integral with the first portion and depending away from the first portion, the sidewall portion comprising a relieved region;
    a bracket selectively mounted in the relieved region of the sidewall portion of the chassis, the bracket comprising first and second legs disposed at a distance from one another, the first and second legs each being provided with a hole to provide a bearing surface for pivotable movement;
    a fitting comprising first and second arms extending outwardly from an integral transversely depending conduit portion, each of the first and second arms being captured in the respective holes of the first and second legs of the bracket when the bracket is mounted to the chassis; and
    a conduit selectively connected to the conduit portion of the fitting for routing cables connected to the circuitry connected to the load board to an external location.

2. The test head according to claim 1 wherein the first portion is a rectangular planar portion and the sidewall portion of the chassis comprises first, second, third, and fourth sidewalls depending perpendicularly away from the planar portion to form a rectangular surround for the circuitry connected to the load board.

3. The test head according to claim 1 wherein the relieved region comprises a rectangular cutout in the sidewall portion of the chassis.

4. The test head according to claim 2 wherein the relieved region comprises a rectangular cutout in one of the first, second, third, and fourth sidewalls.

5. The test head according to claim 1 wherein each of the first and second legs comprises a flange mounted to the sidewall portion of the chassis and an end cap disposed at a distance from the flange, the flange and the end cap each having a hole for capturing the respective first and second arms of the fitting.

6. The test head according to claim 1, further comprising strain relief means disposed between at least one of the first and second arms of the fitting and the circuitry connected to the external load board for relieving strain on the cables.

7. The test head according to claim 6 wherein the strain relief means comprises:
    a curved plate mounted to at least one of the first and second legs of the bracket, the plate having a plurality of perforations; and
    at least one cable tie intertwined through the perforations and around the cables to secure the cables to the plate.

8. The test head according to claim 1, further comprising:
    a dolly having a base, a column fixed to the base, and first and second arms mounted to the column and extending outwardly from the column;
    pivot means mounted to the first and second arms of the dolly; and
    adapter plates mounted to the sidewall portion of the chassis at first and second pivot regions;
    the pivot means being interfitted with the adapter plates to mount the test head to the dolly to provide a pivot connection between the test head and the dolly.

9. The test head according to claim 1, further comprising at least one external cooling fan for supplying cooling air through the conduit, the conduit having a diameter adequate to route the cables from the test head and to permit cooling air to flow through the conduit to the test head, and wherein the sidewall portion has at least one vent for the cooling air to exit the test head.

10. A test head for an electronic circuit tester, comprising:
    a housing, the housing comprising a chassis for mounting circuitry for connection to an external load board, the chassis including a planar portion and a sidewall portion integral with the planar portion and depending perpendicularly away from the planar portion, the sidewall portion comprising a relieved region;
    a bracket selectively mounted in the relieved region of the sidewall portion of the chassis, the bracket comprising first and second legs disposed at a distance from one another, the first and second legs each being provided with a circular hole to provide a bearing surface for pivotable movement;
    a fitting comprising first and second tubular arms extending outwardly from an integral transversely depending conduit portion, each of the first and second arms being captured in the respective holes of the first and second legs of the bracket when the bracket is mounted to the chassis; and
    a conduit selectively connected to the conduit portion of the fitting for routing cables connected to the circuitry connected to the load board to an external location;

the chassis being pivotable with respect to the conduit to at least three positions including a first position with the planar portion of the chassis positioned in a first upward facing position so that the load board and a fixture board can be mounted to the test head and calibrated by an operator, a second position so that the fixture board can be interfaced with a material handler, and a third downward facing position so that the fixture board can interface with a wafer to test an electronic circuit on the wafer, whereby setup and calibration of, and measurements with, the electronic circuit tester are facilitated.

11. The test head according to claim 10 wherein the planar portion is rectangular and the sidewall portion of the chassis comprises first, second, third, and fourth sidewalls depending perpendicularly away from the planar portion to form a rectangular surround for the circuitry connected to the load board.

12. The test head according to claim 10 wherein the relieved region comprises a rectangular cutout in the sidewall portion of the chassis.

13. The test head according to claim 11 wherein the relieved region comprises a rectangular cutout in one of the first, second, third, and fourth sidewalls.

14. The test head according to claim 10 wherein each of the first and second legs comprises a flange mounted to the sidewall portion of the chassis and an end cap disposed at a distance from the flange, the flange and the end cap each having a circular hole for capturing the respective first and second arms of the fitting.

15. The test head according to claim 10, further comprising strain relief means disposed between at least one of the first and second arms of the fitting and the circuitry connected to the external load board for relieving strain on the cables.

16. The test head according to claim 15 wherein the strain relief means comprises:

a curved plate mounted to at least one of the first and second legs of the bracket, the plate having a plurality of perforations; and at least one cable tie intertwined through the perforations and around the cables to secure the cables to the plate.

17. The test head according to claim 10, further comprising:

a dolly having a base, a column fixed to the base, and first and second arms mounted to the column and extending outwardly from the column;

pivot means mounted to the first and second arms of the dolly; and adapter plates mounted to the sidewall portion of the chassis at first and second pivot regions;

the pivot means being interfitted with the adapter plates to mount the test head to the dolly to provide a pivot connection between the test head and the dolly.

18. The test head according to claim 10, further comprising at least one external cooling fan for supplying cooling air through the conduit, the conduit having a diameter adequate to route the cables from the test head and to permit cooling air to flow through the conduit to the test head, and wherein the sidewall portion has at least one vent for the cooling air to exit the test head.

19. In an electronic circuit tester having means for measuring the response of electrical signals applied to an electronic circuit under test, the electronic circuit tester having a test head including a chassis for mounting circuitry for connection to an external load board in turn coupled to the electronic circuit under test, the improvement comprising:

a relieved region in the chassis;

a bracket selectively mounted in the relieved region of the chassis, the bracket comprising first and second legs disposed at a distance from one another, the first and second legs each being provided with a hole to provide a bearing surface for pivotable movement;

a fitting comprising first and second arms extending outwardly from an integral transversely depending conduit portion, each of the first and second arms being rotatably captured in the holes of the respective first and second legs of the bracket when the bracket is mounted to the chassis; and a conduit selectively connected to the conduit portion of the fitting for routing cables connected to the circuitry connected to the load board to an external location.

20. The electronic circuit tester according to claim 19 wherein each of the first and second arms comprises a flange mounted to the chassis and an end cap disposed at a distance from the flange, the flange and the end cap each having a circular hole for rotatably capturing the arms of the fitting.

21. The electronic circuit tester according to claim 19, further comprising strain relief means disposed between at least one of the first and second arms of the fitting and the circuitry connected to the external load board for relieving strain on the cables.

22. The electronic circuit tester according to claim 21 wherein the strain relief means comprises:

a curved plate mounted to at least one of the first and second legs of the bracket, the plate having a plurality of perforations; and at least one cable tie intertwined through the perforations and around the cables to secure the cables to the plate.

23. The electronic circuit tester according to claim 19, further comprising at least one external cooling fan for supplying cooling air through the conduit, the conduit having a diameter adequate to route the cables from the test head and to permit cooling air to flow through the conduit to the test head, and wherein the sidewall portion has at least one vent for the cooling air to exit the test head.

* * * * *